United States Patent [19]

Shimizu et al.

[11] Patent Number: 4,618,397
[45] Date of Patent: Oct. 21, 1986

[54] METHOD OF MANUFACTURING SEMICONDUCTOR DEVICE HAVING A PRESSURE SENSOR

[75] Inventors: Isao Shimizu, Tamamura; Kazuji Yamada, Hitachi, both of Japan

[73] Assignee: Hitachi, Ltd., Tokyo, Japan

[21] Appl. No.: 802,431

[22] Filed: Nov. 27, 1985

Related U.S. Application Data

[62] Division of Ser. No. 563,748, Dec. 21, 1983.

[30] Foreign Application Priority Data

Dec. 24, 1982 [JP] Japan ............................. 57-226274

[51] Int. Cl.⁴ .................. H01L 21/306; B44C 1/22; C03C 15/00; C03C 25/06
[52] U.S. Cl. .................. 156/628; 29/610 SG; 29/580; 148/1.5; 148/175; 148/187; 156/647; 156/657; 156/659.1; 156/662

[58] Field of Search .......... 29/610 SG, 580; 156/628, 647, 657, 659.1, 662; 148/1.5, 187, 190, 175; 357/26, 91; 338/2, 4; 73/719, 720, 721

[56] References Cited

U.S. PATENT DOCUMENTS 3,858,150 12/1974 Gurtler et al. ..................... 338/2
4,033,787  7/1977 Marshall .......................... 148/1.5
4,372,803  2/1983 Gigante ........................ 156/628 X Primary Examiner—William A. Powell
Attorney, Agent, or Firm—Antonelli, Terry & Wands

[57] ABSTRACT

The present invention relates to a semiconductor device having a semiconductor pressure sensor, which includes a heavily-doped semiconductor layer having a predetermined impurity concentration gradient and formed at the bottom of a diaphragm (membrane portion). Owing to the presence of this semiconductor layer, a flat diaphragm is formed, and a semiconductor pressure sensor of high precision is provided.

9 Claims, 24 Drawing Figures

METHOD OF MANUFACTURING SEMICONDUCTOR DEVICE HAVING A PRESSURE SENSOR

This is a division of application Ser. No. 563,748, filed Dec. 21, 1983.

List of the Prior Art (37 CFR 1.56 (b))

(1) U.S. Pat. No. 3,893,228
(2) IEEE ELECTRON DEVICE LETTERS. VOL. EDL-2, No. 2, FEBRUARY 1981, pp. 44–45
(3) J. Electrochem. Soc.: ELECTROCHEMICAL TECHNOLOGY February 1971, pp. 401–402

BACKGROUND OF THE INVENTION

The present invention relates to a semiconductor device having a pressure sensor, for example, a semiconductor device having a silicon diaphragm type pressure sensor.

Semiconductor pressure sensors are known to have the advantages of small size, low-cost and high performance compared with other types of pressure sensors such as the well-known Bourdon tube or mechanical pressure sensors employing bellows. In particular silicon diaphragm type pressure sensors of the most common type semiconductor pressure sensor, and generally possess these advantages.

As shown in FIG. 1, the structure of such a silicon diaphragm type pressure sensor generally consists of a membrane portion 3 (or a relatively thin portion) which is formed so thin as to be deformed by the difference of pressures in spaces over and under this portion. More particularly, the device is formed to comprise a depressed portion 2 in a part of the rear surface of a silicon chip (single crystal Si substrate) 1, and four diffused resistors 4 which are formed as piezoresistive elements in the front surface of the membrane portion 3. The diffused resistors are connected as a bridge network, and the electrical resistances of the resistors change when the membrane portion 3 is deformed by mechanical motion or stress. Thus, the semiconductor pressure sensor detects pressure electrically by virtue of these changes in the resistance of the bridge arrangement.

Such silicon diaphragm type pressure sensor can be manufactured by the following steps. First of all, B (boron) is diffused into parts of the one surface of a single crystal Si substrate 1, thereby to form the diffused resistors 4. The other surface of the Si substrate 1 is ground like a mirror. Thereafter, as shown in FIG. 2, the other surface part of the single crystal Si substrate 1 having approximately 280 $\mu$m thickness is subjected to anisotropic etching with an alkali etchant such as KOH (potassium hydroxide), whereby the depressed portion 2 is formed so as to leave the membrane portion 3 which is approximately 25 $\mu$m in thickness.

The following problems, however, have been recognized by the inventors.

To begin with, in etching the depressed portion, it is difficult to form the membrane portion 3, namely the diaphragm, uniformly and precisely at the thickness of approximately 25 $\mu$m. Also, as shown in FIG. 2, the etched Si surface which corresponds to the membrane portion 3 does not become flat on account of such drawbacks as foreign material, contamination and crystal defects. Instead, it is formed with corrugations 5 which have an unevenness of $\pm 5$ $\mu$m. The corrugations are apt to cause strain in the case of the pressure deformation, and this greatly limits the ability to manufacture pressure sensors of high sensitivity with good reproducibility.

Regarding such a semiconductor pressure sensor, a method of forming the membrane portion to an accurate thickness is disclosed in the specification of U.S. Pat. No. 3,893,228. According to the disclosure, the thickness of the membrane portion is controlled by utilizing a p+-type epitaxial layer as an etching stopper. The literature, however, does not disclose the flattening of the membrane portion at all and does not contain any suggestive statement regarding this. In reviewing this patent, the applicants have concluded that it is unlikely that the method of forming the semiconductor pressure sensor taught in the literature will satisfactorily flatten the membrane portion for the reason stated below.

As is well known, in a case where a semiconductor layer has been formed on a semiconductor substrate by epitaxial growth, it has a uniform impurity concentration in the thickness direction thereof. In the case of the disclosed technique, therefore, an abrupt change is involved between the impurity concentration of the substrate and that of the epitaxial semiconductor layer. As shown in FIG. 3a, accordingly, when the rear (the other) surface of the substrate 1 has been etched while holding an uneven state (indicated by a dotted line) till arriving at the epitaxial semiconductor layer EP, parts of the substrate 1 are left as protuberances 5. In order to completely remove the protuberances 5, the substrate 1 must be exposed to an etchant for a a certain period of time. Meantime, the epitaxial semiconductor layer EP is also etched, although at a rate lower than the etching rate of the protuberances 5. In any event, because of this etching of the layer EP, after the protuberances 5 have been completely removed, the epitaxial semiconductor layer EP is left with an undesirably roughened surface as shown in FIG. 3b. Further, it is difficult to perfectly remove the roughened surface to provide a smooth surface, because the epitaxial semiconductor layer EP has a uniform impurity concentration, as noted previously.

SUMMARY OF THE INVENTION

Accordingly, it is an object of the present invention to eliminate the problems described above, and to provide a semiconductor pressure sensor whose membrane portion has a uniform thickness.

Another object of the present invention is to provide a semiconductor device in which a pressor sensor and active elements such as transistors coexist within a single semiconductor body.

Still another object of the present invention is to provide a novel method of manufacture for producing the aforementioned semiconductor device.

The present invention consists in that a heavily-doped impurity layer having concentration gradient is formed at the etched surface of the membrane portion (the diaphragm) of a pressure sensor, and that active elements coexist with the pressure sensor in the parts of a semiconductor body.

DESCRIPTION OF THE PREFERRED EMBODIMENTS

Now, the contents of the present invention will be concretely described in conjunction with embodiments.

Embodiment 1:

FIGS. 4 to 8 illustrate a process for manufacturing a silicon diaphragm type pressure sensor to which the present invention is applied.

Figure 1:
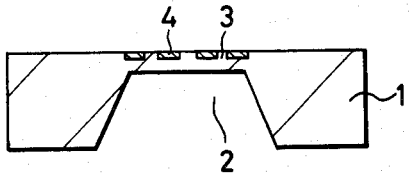
FIG. 1 is a sectional view showing an example of a prior-art silicon diaphragm type pressure sensor.
Figure 2:
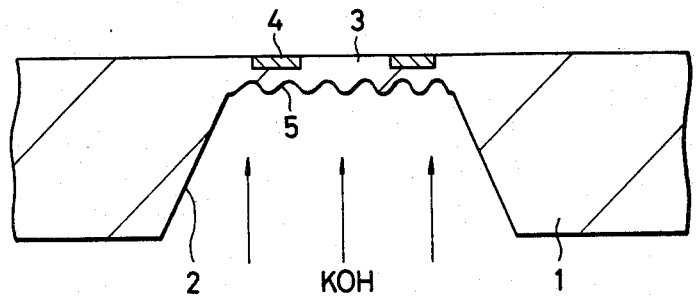
FIG. 2 is a sectional view for showing the problem of the pressure sensor shown in FIG. 1.
Figure 3A:
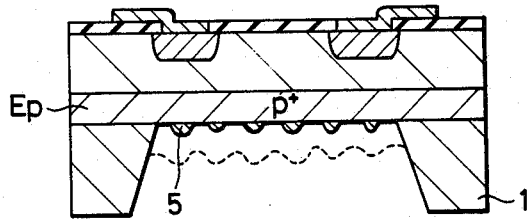
FIGS. 3a and 3b are sectional views for showing the problem of a silicon pressure sensor which is disclosed in the specification of U.S. Pat. No. 3893228.
Figure 3B:
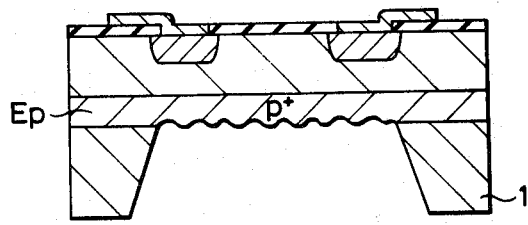
Figure 4:
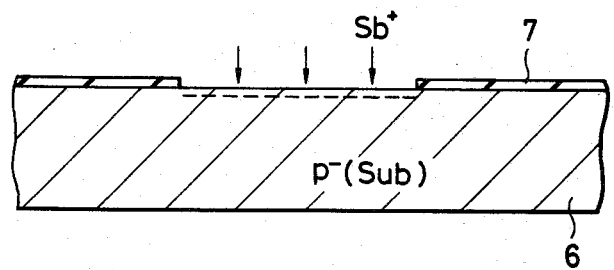
FIGS. 4 to 8 are sectional flow diagrams showing the essential portions of a process for manufacturing a pressure sensor according to the present invention.

(1) As shown in FIG. 4, a lightly-doped p-type single crystal Si substrate (wafer) 6 having a thickness of approximately 400 $\mu$m is prepared. The one (front) surface of this Si substrate is formed with an oxide film ($SiO_2$ film) 7 having thickness of 8000 Å–9000 Å. This oxide film 7 is produced by the thermal oxidation of the Si substrate 6, for example, by heating the substrate at 1100° C. in wet $O_2$ for 110 minutes. Next, an important step for attaining a precise thickness for the membrane portion (or the relatively thin portion) of the pressure sensor is performed. In order to form a heavily-doped semiconductor region serving as an etching stopper, as illustrated in FIG. 4, an n-type impurity such as Sb (antimony) is introduced into the front surface of the substrate by predeposition or ion implantation by employing the oxide film ($SiO_2$ film) 7 as a mask for introducing the impurity. More specifically, first, the oxide film 7 is selectively etched by the well-known photoetching process in order to expose the selected area of the substrate surface into which the n-type impurity is to be introduced. Subsequently, using the remaining oxide film 7 as the mask, the n-type impurity is introduced into the exposed front surface of the substrate. The layer of the introduced n-type impurity is as shallow as 0.1 $\mu$m–0.2 $\mu$m. Regarind the introduction of the n-type impurity, in a case where the introducing method is the predeposition, $Sb_2O_3$ can be deposited on the front surfaces of Si wafers in such a way that a solid impurity source such as of the $Sb_2O_3$ is placed in a quartz diffusion tube together with the Si wafers, that Ar gas and $O_2$ gas are used as carrier gases, and that a furnace in which the tube is inserted is held at a temperature of 900° C. On the other hand, in case of the ion implantation, when ions are introduced at a high density all at once, the substrate surface suffers undesirable ion damage. Therefore, multiple ion implanting operations are performed, each of which is set at the implantation energy level of 75 keV–125 keV and the dosage of $1 \times 10^{14}$ atoms/cm$^2$.

Figure 5:
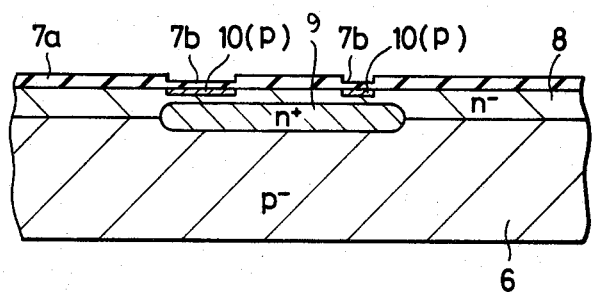

(2) The oxide film 7 is removed using fluoric acid as an etchant. As shown in FIG. 5, a lightly-doped n-type Si layer 8 having 25–30 $\mu$m thickness is formed on the front surface of the substrate 6 by epitaxial growth. This epitaxial growth is carried out by the thermodecomposition of silane ($SiH_4$), and a preferable temperature at that time is approximately 1100° C. During the epitaxial growth, the predeposited or ion-implanted Sb is diffused into the substrate 6 and the Si layer 8 by drive-in diffusion, to form a heavily-doped n-type buried layer 9 (thickness: 2 $\mu$m) which has an impurity concentration gradient (peak value: about $10^{19}$ atoms/cm$^2$).

An insulator film 7a is formed on the surface of the Si layer 8. The formation of the insulator film 7a can be achieved by a method similar to the method of forming the oxide film 7. That is, the Si substrate 6 formed with the Si layer 8 is heated at 1100° C. in wet $O_2$ for 110 minutes, whereby the surface of the Si layer 8 is oxidized to be formed with the oxide film ($SiO_2$ film) 7a. Subsequently, in order to form four semiconductor resistor regions, i.e., four piezoresistive elements, in the selected areas of that part of the Si layer 8 which overlies the n-type buried layer 9, the oxide film 7a is selectively removed by the well-known photoetching process so as to expose the part of the n-type Si layer 8. A p-type impurity, for example, B (boron) is introduced into the exposed surface of the Si layer 8 by predeposition or ion implantation. The p-type impurity introduced in the Si layer 8 is subjected to drive-in diffusion, thereby to form p-type diffused resistor regions 10 which are 2–3 $\mu$m thick and which have the sheet resistance of 100 ohm per square. In case of the predeposition, a solid impurity source such as of $B_2O_3$ is placed in a quartz diffusion tube together with Si wafers, and the $B_2O_3$ is deposited on the surfaces of the Si wafers at the temperature of about 900° C. while the interior of the silica tube is held in a reduced pressure condition. On the other hand, in case of the ion implantation, boron ions are implanted into Si wafers. At this time, the implantation energy level is 75 keV, and the dosage is $1 \times 10^{13}$ atoms/cm$^2$.

In the case of the predeposition method, after performing the drive-in diffusion, boron glass deposited on the surfaces of the diffused resistor regions 10 and the surface of the oxide film 7a is removed. Thereafter, the exposed surfaces of the diffused resistor regions 10 are oxidized, whereby thin oxide films ($SiO_2$ films having a thickness of approximately 500 Å) 7b are formed on the diffused resistor regions 10.

In the case of the ion implantation method, preferably oxide films 7b (thickness: 100 Å) are formed before the execution of the ion implantation in order to prevent the ion damage of the surface of the Si layer 8, whereupon the boron ions are introduced into the Si layer 8 through the oxide films 7b.

Figure 6:
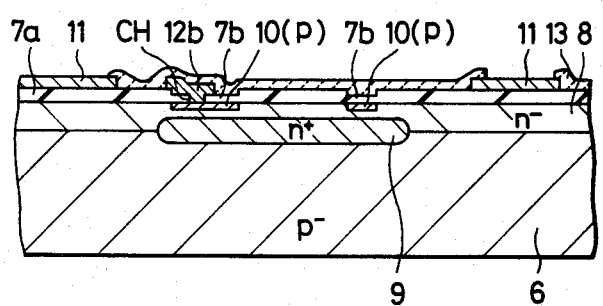

(3) As shown in FIG. 6, in order to lead out electrodes from the diffused resistor regions 10, the $SiO_2$ films 7b are selectively etched to form contact holes CH. Thereafter, Al (aluminum) layer (1–1.75 μm thickness) are formed on the surfaces of the SiO₂ films 7a and 7b by evaporation. Further, terminal portions 11, and the electrodes 12 ohmically connected to the respective diffused resistor regions 10 are formed by the photoetching process. Subsequently, a final passivation film 13 (thickness: 1.2 μm) made of plasma nitride or PSG (phosphosilicate glass) is formed. This final passivation film 13 serves to protect the SiO₂ films 7a, 7b and the electrode 12. In particular, since the plasma nitride has a stable film property, the use thereof is desirable. A stacked film in which a PSG film (thickness: 0.2 μm) and a plasma nitride film (thickness: 1.1 μm) are successively formed on the SiO₂ films 7a, 7b may well be employed as the final passivation film. For some purposes or in some applications, the passivation film 13 on the diffused resistors 10 of the pressure sensor portion is especially removed to leave only the thin oxide films (SiO₂ films) 7b thereon, whereby nonuniformity in the strains of the resistors attributed to dispersions in the quality and thickness of the passivation film is prevented.

Figure 7:
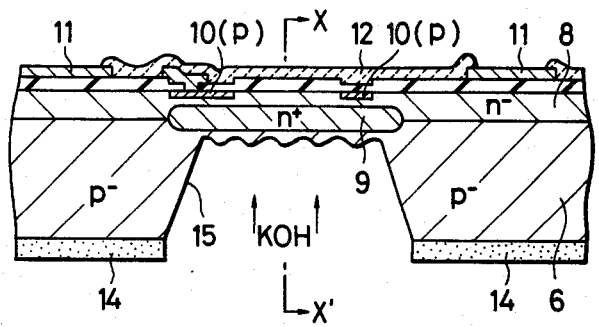

(4) As shown in FIG. 7, a photoresist mask 14 is provided on the rear surface ((100) crystallographic plane) of the p-type substrate 6, and anisotropic etching is performed with an alkali etchant such as KOH, whereby a deep depressed portion 15 is formed. The depressed portion is etched so as to reach the n⁺-type buried layer 9. During the etching, the etched surface of the substrate does not become flat. On the contrary, the etched surface is quite rough, as shown in FIG. 7.

Figure 9A:
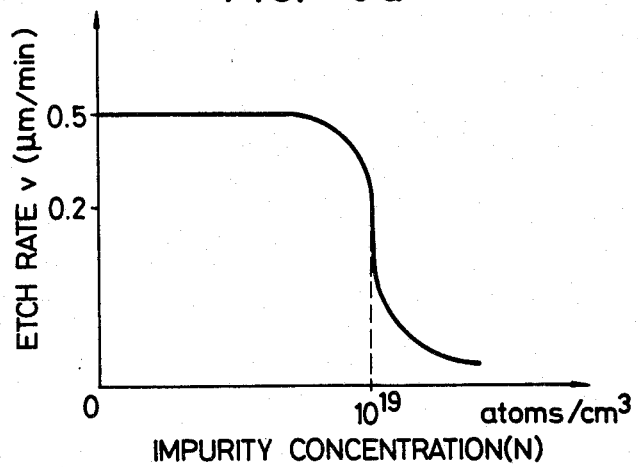
FIG. 9a is a graph showing the relationship between an impurity concentration in a semiconductor and the rate of etching by an alkali etchant.

In case of alkali-etching a silicon crystal substrate doped with an impurity, the relationship between the impurity concentration and the etching rate is as shown in FIG. 9a. While the impurity concentration is low, the etching rate does not change, whereas when the former reaches the concentration of $10^{19}$ atoms/cm³, the etching rate decreases rapidly.

Figure 8:
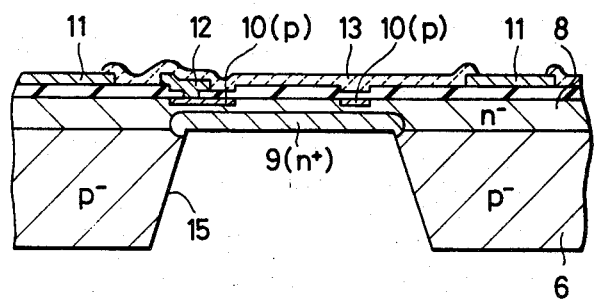
Figure 9B:
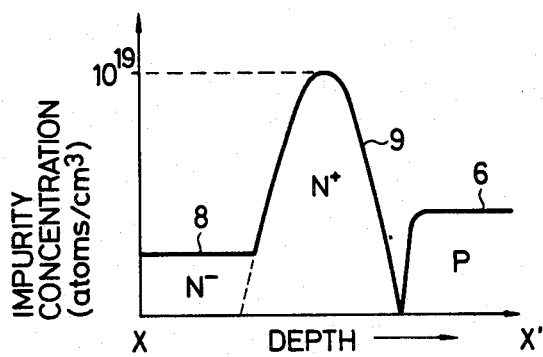
FIG. 9b is a diagram showing the impurity profile of the part of a semiconductor taken along line X—X' in FIG. 7.
Figure 9C:
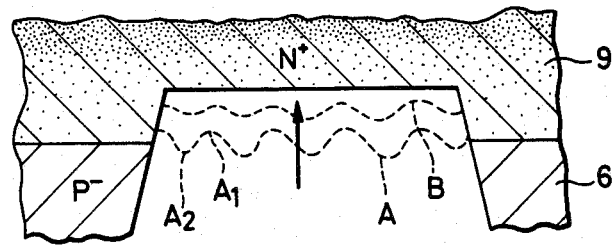
FIG. 9c is a partly enlarged sectional view of the semiconductor shown in FIG. 7.

On the other hand, the impurity profile taken along line X—X' of the semiconductor shown in FIG. 7 is depicted in FIG. 9b. As is apparent from this figure, the n⁺-type buried layer 9 has an impurity concentration gradient because it has been formed by the drive-in diffusion. For this reason, when the etching has reached the heavily-doped buried layer, the etching rate is decelerated, so that a flat etched surface is gradually formed as shown in FIG. 9c. More specifically, referring to FIG. 9c, when the n⁺-type buried layer 9 has been reached, the roughness of the etched surface is somewhat great as indicated by a dotted line A. However, as the etching proceeds in the direction of an arrow, the impurity concentration of the n⁺-type buried layer 9 becomes high, so that a recess $A_1$ is etched at a low rate, while a protuberance $A_2$ is efficiently etched owing to an etching rate somewhat higher than that of the recess $A_1$. Therefore, the roughness of the etched surface decreases as indicated by a dotted line B. In this way, the etching rate is controlled so that a flat etched surface is achieved as shown in FIG. 8.

Figure 10:
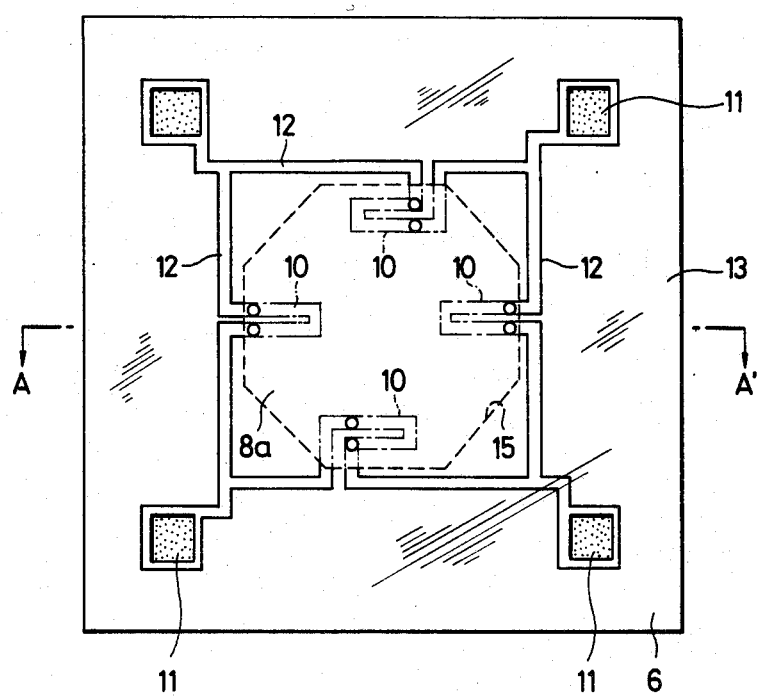
FIG. 10 is a plan view showing an embodiment of a pressure sensor according to the present invention.
Figure 11:
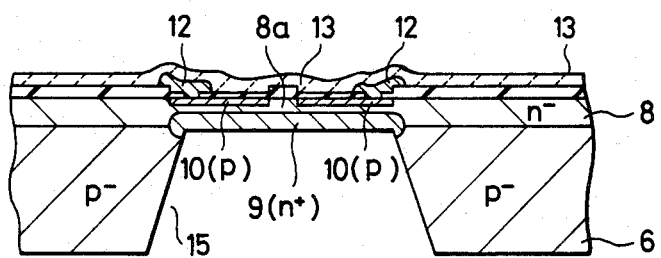
FIG. 11 is a sectional view taken along line A—A' in FIG. 10.

FIG. 10 shows the layout of the four diffused resistors 10 and the configuration of the bridge-connected electrodes 12 in the silicon diaphragm type sensor. These electrodes 12 are to be connected to a detector circuit (not shown) through the terminals (bonding pads) 11. FIG. 11 is a sectional view of the sensor taken along line A-A' in FIG. 10.

Figure 12:
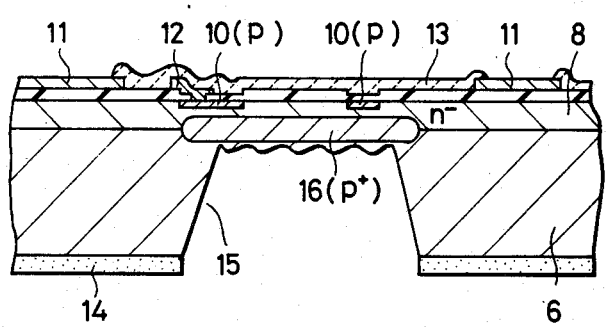
FIG. 12 is a sectional view showing another embodiment of the pressure sensor according to the present invention.

In the foregoing embodiment, the n⁺-type buried layer has been utilized for the flattening etching. However, a p⁺-type buried layer may well be utilized instead of the n⁺-type buried layer. FIG. 12 shows a case where, in the step (2) described before, a p⁺-type buried layer 16 is formed in place of the n⁺-type buried layer 9, whereupon the depressed portion 15 is formed so as to reach this layer 16. In order to form the p⁺-type buried layer 16, a p-type impurity such as boron is used, and it is introduced into the Si substrate 6 by predeposition or ion implantation as in the case of forming the n⁺-type buried layer 9. After the impurity introduction for forming the p⁺-type buried layer 16 has been completed, the steps (3) and (4) are carried out. The p⁺-type buried layer 16 has the gradient of the impurity concentration.

EMBODIMENT 2:

FIGS. 13 to 19 show a process for manufacturing an embodiment in which a pressor sensor and other active elements coexist in a single semiconductor body.

Figure 13:
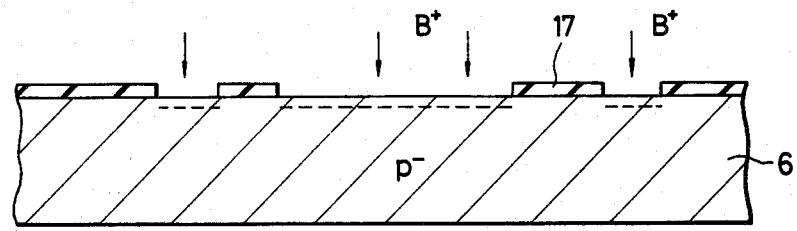
FIGS. 13 to 19 are sectional views showing the essential portions of a process for manufacturing an IC which includes a pressure sensor according to the present invention.

(1) A lightly-doped p-type single crystal Si substrate 6 having a thickness of approximately 400 μm is prepared. As illustrated in FIG. 13, using an oxide film (as a mask e.g. SiO₂ film having a thickness of 8000 Å–9000 Å), 17, boron ions (B⁺) are implanted into the part of the front surface of the substrate to form the pressure sensor and the part thereof to form an isolation region. The implantation energy of the boron ions is preferably 75 keV–125 keV, and the implantation dosage is $10^{14}$ atoms/cm²–$10^{16}$ atoms/cm².

Figure 14:
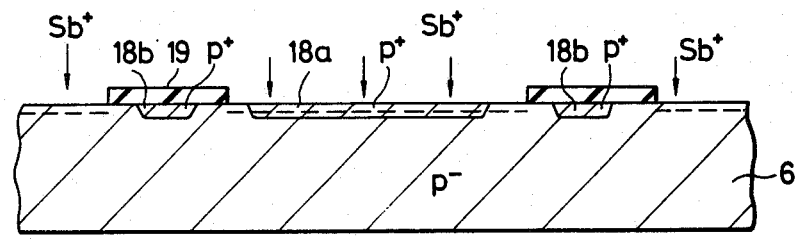

The implanted boron ions are subjected to drive-in diffusion by a heat treatment, whereby p⁺-type layers 18a and 18b are simultaneously formed, respectively, as shown in FIG. 14. The p⁺-type buried layer 18a is used as an etching stopper in forming the depressed portion of the pressure sensor, and the p⁺-type buried layer 18b as a part of the isolation region.

(2) After removing the oxide film 17, a new oxide film (SiO₂ film having a thickness of 8000 Å–9000 Å) 19 is formed by thermal oxidation. The p-type impurity (boron) is subjected to the drive-in diffusion during the formation of the oxide film 19, whereby the p⁺-type buried layers 18a and 18b shown in FIG. 14 are formed as stated above.

Subsequently, the step for forming n⁺-type buried layer is carried out in order to prevent the occurrence of a substrate parasitic transistor operation in the pressure sensor portion and to reduce a collector resistance in the active element portion such as a vertical transistor or to prevent the occurrence of a substrate parasitic transistor operation in the active element portion such as a lateral transistor. Namely, first of all, the oxide film 19 is selectively etched thereby to form a mask for introducing an impurity into selected areas. Using this mask, the n-type impurity such as antimony is introduced into the exposed surface areas of the Si substrate 6 by predeposition or ion implantation.

FIG. 14 shows the case of the ion implantation. In this case, the antimony ions (Sb⁺) are implanted into the front surface of the Si substrate 6 at an implantation energy level of 75 keV–125 keV. The dosage of the implantation is $10^{14}$ atoms/cm²–$10^{16}$ atoms/cm².

On the other hand, in case of the predeposition, as in the foregoing embodiment 1, a solid impurity source such as Sb₂O₃ is placed in a quartz diffusion tube together with Si wafers, Ar gas and O₂ gas are used as carrier gases, and a furnace in which the tube is inserted is held at a temperature of 900° C., whereby the Sb₂O₃ is deposited on the front surfaces of the Si wafers.

In order to prevent of the occurrence of a parasitic p-n-p transistor, the antimony is introduced into the pressure sensor forming portion so as to overlie the p+-type buried layer 18a and to be broader than it, as shown in FIG. 14.

Figure 15:
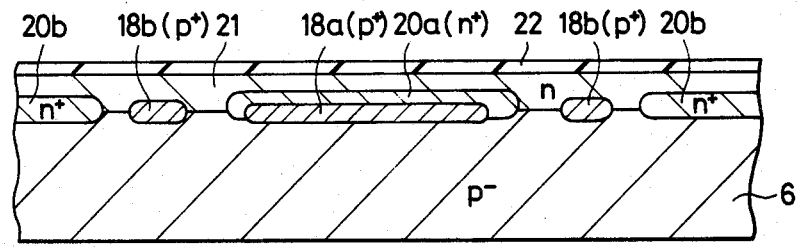

(3) After removing the oxide film (SiO$_2$ film) 19, a lightly-doped n-type epitaxial Si layer (impurity concentration: $10^{15}$ atoms/cm$^3$, thickness: 30 μm) 21 is formed on the entire surface as shown in FIG. 15. At this time, the p+-type buried layers 18a, 18b and n+-type buried layers 20a, 20b are respectively formed by the boron ions (B+) and antimony ions (Sb+) introduced by the preceding steps. The impurity concentrations of the p+-type buried layers 18a, 18b and the n+-type buried layers 20a, 20b exhibit peak values of about $10^{19}$ atoms/cm$^3$. The formation of the epitaxial Si layer 21 is achieved by the thermodecomposition of silane, and a preferable temperature at that time is about 1100° C. Next, an oxide film (SiO$_2$ film having a thickness of 8000 Å–9000 Å) 22 is formed on the surface of the epitaxial Si layer 21. The oxide film 22 is formed by thermally oxidizing the surface of the Si layer 21. Also, the oxide film 22 may be formed by the well-known CVD (chemical vapor deposition) process. Further, an insulator film such as of Si$_3$N$_4$ (silicon nitride) may be deposited on the surface of the Si layer 21 instead of the oxide film.

Figure 16:
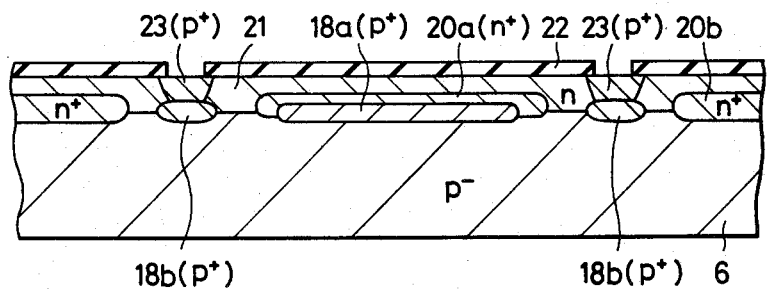

(4) Subsequently, an isolation layer is formed as shown in FIG. 16. First of all, the oxide film 22 is selectively removed by photoresist processing. Using the resultant oxide film (SiO$_2$ film) 22 as a mask for selectively introducing an impurity, the p-type impurity such as boron is introduced into the exposed surface part of the n-type epitaxial Si layer 21, thereby to form the p-type diffused layer (isolation layer) 23 for isolating the elements. Since, at this time, the p-type impurity is diffused into the epitaxial Si layer 21 by drive-in diffusion also from the p+-type buried layer 18b, the isolation can be achieved in a short diffusion time owing to the diffusions in both the directions. Accordingly, lateral diffusion is reduced. Therefore, the area occupied the isolation layer 23 becomes small, and a higher density of integration can be accomplished.

Figure 17:
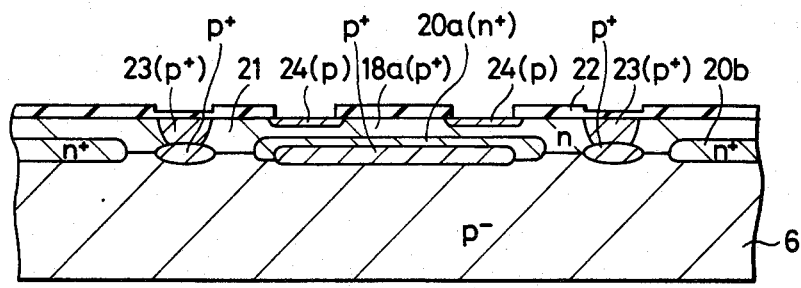

(5) In order to form diffused resistors to constitute the pressure sensor, the SiO$_2$ film 22 is selectively removed with the well-known photoresist processing as shown in FIG. 17. A p-type impurity, e.g., boron is ion-implanted into the exposed surface areas of the Si layer 21, and is thereafter subjected to drive-in diffusion, whereby the p-type diffused resistors 24 are formed. The p-type diffused resistors 24 have the sheet resistance of 100 ohm per square, and are approximately 2-3 μm deep.

Figure 18:
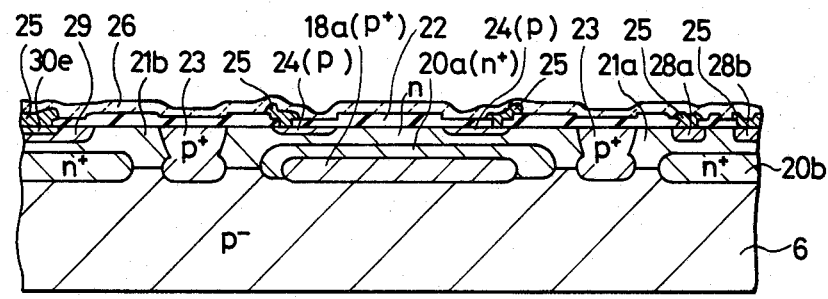

(6) After forming the diffused resistors 24, a p+-type emitter region 28a and a p+-type collector region 28b which constitute a lateral transistor are formed in an island region 21a as shown in FIG. 18, by selective diffusion utilizing the oxide film 22 as a mask. The island region 21a acts as the base region of this transistor. Subsequently, the base region 29 of a vertical transistor is formed in an island region 21b by selective diffusion, and an emitter region 30e is formed in the base region 29. The lateral transistor and the vertical transistor are used for the temperature compensation circuit of the pressure sensor. Next, the SiO$_2$ film 22 is selectively etched to form contact holes in predetermined positions. Thereafter, an Al (aluminum) layer which is 1 μm–1.75 μm thick is formed on the surface of the SiO$_2$ film by evaporation. This Al layer is selectively removed by photoetching so as to form electrodes (conductive layer) 25 which are connected to the respectively element regions. Next, a final passivation film (thickness: 1.3 μm) 26 made of plasma nitride or PSG (phosphosilicate glass) is formed. This final passivation film 26 serves to prevent the SiO$_2$ film 22 from coming into touch with the open air to get stained. In particular, since the plasma nitride has a stable film property, the use thereof is desirable. A stacked film in which a PSG film (thickness: 0.2 μm) and a plasma nitride film (thickness: 1.1 μm) are successively formed on the SiO$_2$ 22 may well be employed as the final passivation film.

As in the foregoing embodiment 1, the passivation film may be removed to leave only the thin oxide film on the pressure sensor portion, whereby nonuniformmity in the strain of the resistors attributed to dispersions in the quality and thickness of the passivation film is decreased.

Figure 19:
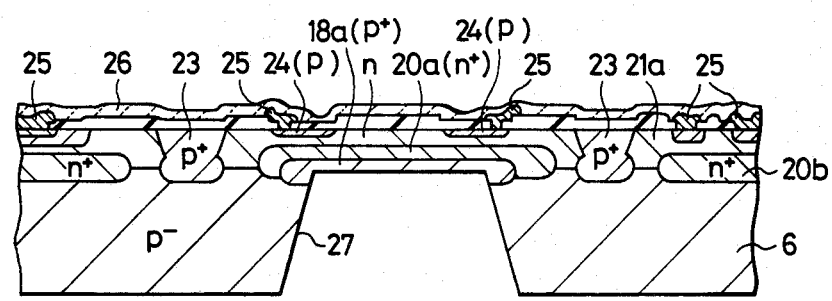

The rear surface of the p-type substrate 6 is anisotropically etched by the alkali etchant such as KOH, to form a depressed portion 27 as shown in FIG. 19. For the same reason as explained in Embodiment 1, the etching for forming the depressed portion has its etching rate controlled after the p+-type buried layer has been reached. Therefore, a flat etched surface is achieved as the surface of the membrane portion 18a.

Figure 20:
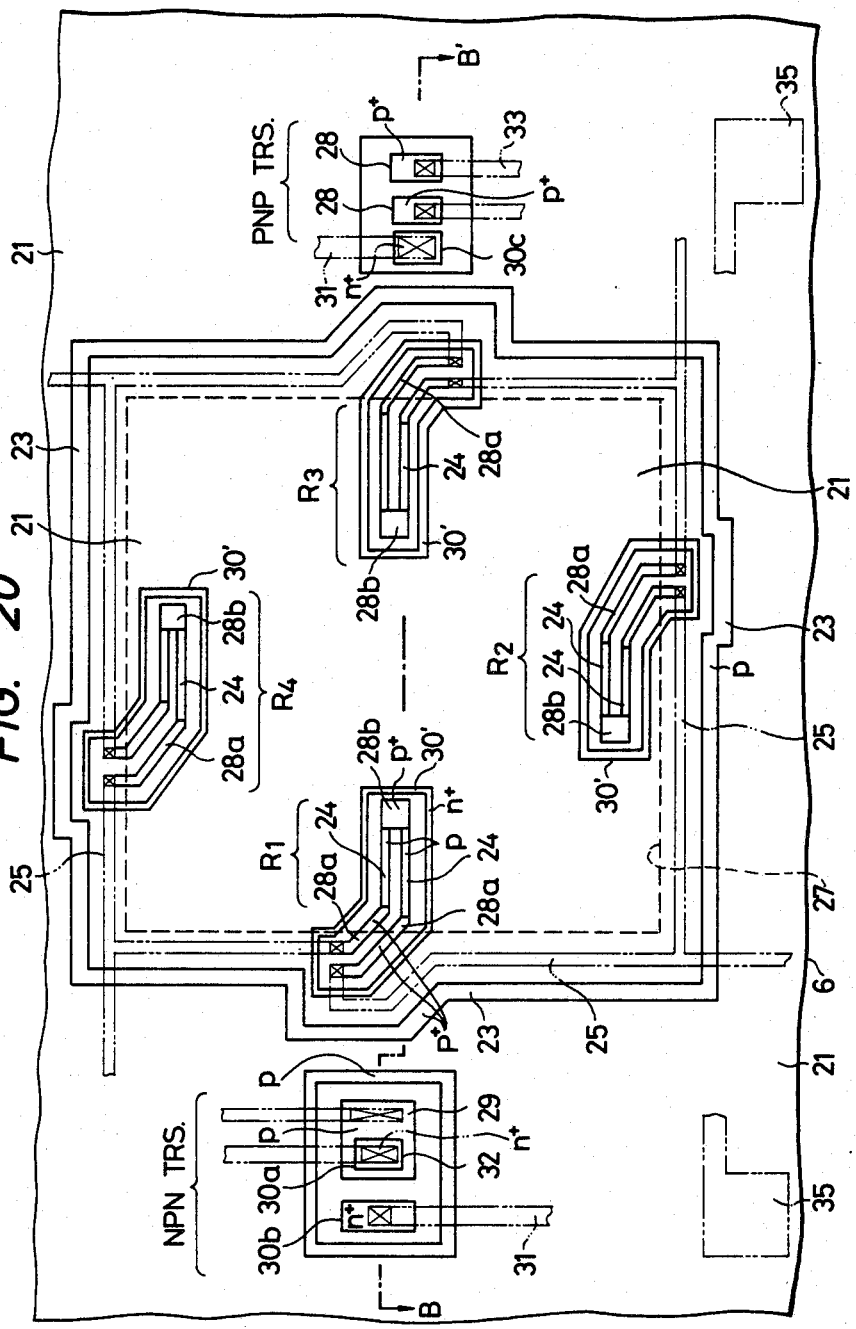
FIG. 20 is a plan view showing the essential portions of an embodiment of the IC which includes the pressure sensor according to the present invention.
Figure 21:
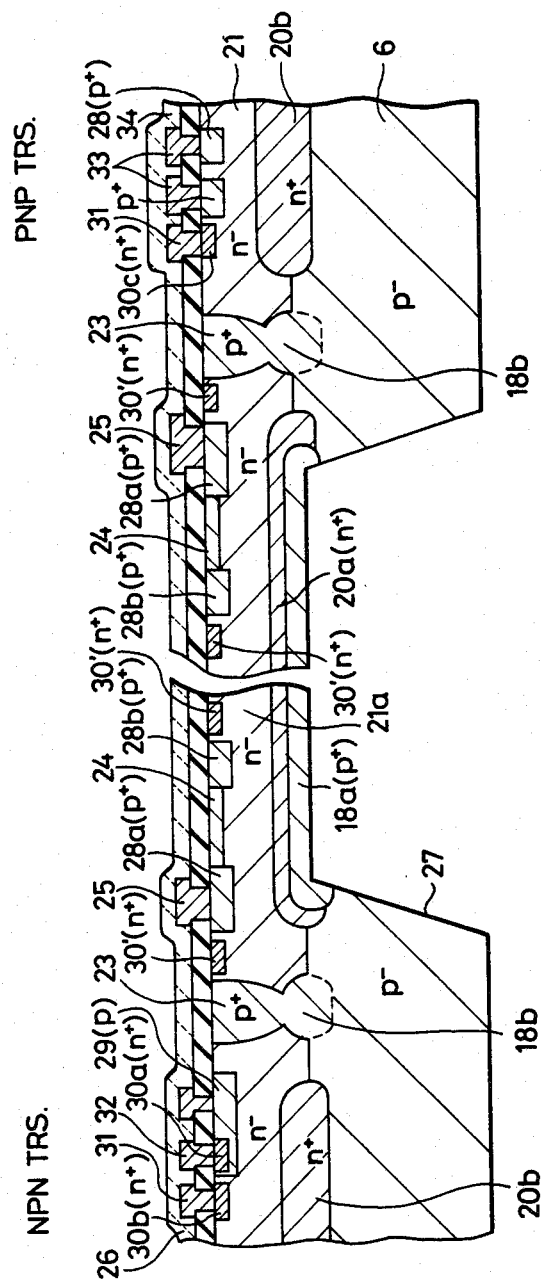
FIG. 21 is a sectional view taken along line B—B' in FIG. 20.

FIGS. 20 and 21 are a plan view and a sectional view, respectively, concretely showing the embodiment of the semiconductor device which is provided by the aforementioned process and in which the other active elements are formed around the pressure sensor. FIG. 20 principally shows the diffused layers, which are indicated by solid lines. The sectional view of FIG. 21 is taken along line B–B' in FIG. 20.

Referring to FIG. 20, the depressed portion 27 or diaphragm is formed on the rear side of substantially the central part of a Si semiconductor body (Si epitaxial layer 21, Si substrate 6) having the (100) crystallographic plane. The p+-type isolation layer 23 for isolating the pressure sensor portion from the other elements (active elements) is formed so as to surround the diaphragm. The sides of the diaphragm (27) surrounded with the isolation layer 23 are respectively formed with the resistors (diffused resistors) for use as the pressure sensor. As can be seen from FIG. 20, these resistors have the same structure and are connected by the wiring layers 25 as the bridge network. The structure of the resistor will be explained as follows.

Each of resistors (R$_1$–R$_4$) is composed of p-type diffused resistor layers 24 (sheet resistance: 100 ohm per square) which are formed in the direction of the <110> axis; p+-type diffused layers for contacts, 28a (sheet resistance: 30 ohm per square) which are formed in the direction of the <100> axis inclining by 45 degrees to the <110> axis; and a p+-type diffused layer 28b (sheet resistance: 30 ohm per square) which connects the p-type diffused resistor layers 24 extending in parallel with each other. The p-type diffused resistor layer 24 extending in the direction of the <110> axis (or an axis equivalent thereto) is sensitivity in the piezoresistive effect, so a resistance changes sensitively to the strain of the diaphragm. This is especially remarkable in the case of the resistor layer which has the p-conductivity type. On the other hand, the p+-type diffused layer 28a is in the direction of a low piezo-resistive effect (the direction of the <100> axis or an axis equivalent thereto) and is heavily doped, so that the change of its resistance relative to the strain of the diaphragm is small and negligible. Further, the p+-type diffused layer 28b is heavily doped and is formed so as to form a square, so that the influence thereof on the strain of the diaphragm is negligible. The p+-type diffused layers 28a and 28b are formed simultaneously with the emitter and collector regions 28 of the P-N-P transistor (indicated as PNP TRS in FIG. 20). In order to prevent the leakage current between the resistors within the diaphragm, an n+-type diffused layer 30' is formed so as to surround the p-type diffused resistor layers 24 and the p+-type diffused layers 28a, 28b. This n+-type diffused layer 30' is formed simultaneously with the emitter region 30a and collector contact region 30b of the N-P-N transistor (indicated as NPN TRS in FIG. 20) and the base contact region 30c of the P-N-P transistor by the use of an n-type impurity such as arsenic (As) or phosphorus (P). The P-N-P transistor and N-P-N transistor which are sited around the diaphragm constitute a temperature compensation circuit, an amplifier circuit. In addition, external lead-out terminals (bonding pads) 35 are sited on the peripheral edges of the semiconductor body. As can be seen from FIG. 21, the bottom of the diaphragm 27 is formed with the heavily-doped p+-type buried layer 18a which has the gradient of the impurity concentration and which serves as the etching stopper. The p+-type buried layer 18a is overlaid with the n+-type buried layer 20a, which prevents the operation of a parasitic p-n-p transistor (p-type diffused resistor layer 24–n−-type epitaxial Si layer 21a–p+-type buried layer 18a). That is, the carriers are recombined by the heavily-doped n+-type buried layer 20a, thereby to prevent the transportation of the carriers from the p-type diffused resistor layer 24 to the p+-type buried layer 18a.

According to the constructions described above in conjunction with the embodiments, the objects of the invention can be accomplished and many other effects are brought forth as follows.

(1) A buried layer which is heavily doped and which has the gradient of the impurity concentration is formed in a pressure sensor region (at the etched side of a diaphragm), whereby a flat surface is obtained at the etched side of a membrane portion when a depressed portion is etched.

(2) A heavily-doped p+-type layer is disposed under an n+-type buried layer, whereby the exposure of the p-n junction between the n+-type buried layer and the p−-type substrate can be avoided after the formation of the depressed portion, and the degree of protection is enhanced. In addition, the operation of a parasitic transistor can be prevented.

(3) A p+-type buried layer formed around the sensor portion can complete an isolation region of small width when coupled with a p+-type diffused layer which extends from the front surface of an epitaxial n-type Si layer. Therefore, the area occupied by the isolation region can be reduced, and a semiconductor device having a high density of integration can be produced.

(4) n+-type buried layers can be utilized as parts of active elements (the collector of the N-P-N transistor, the base of the lateral P-N-P transistor) in peripheral portions.

(5) A Si membrane portion can be sufficiently thickened by rendering the epitaxial n-type Si layer thick, whereby even a sensor applicable to a high pressure (100 Torr or above) can be manufactured at high precision.

(6) An IC in which the integral combination of active elements of high withstand voltage and a pressure sensor suitable for a high pressure are can be realized by the use of a thick n-type Si layer.

(7) In case of using an n+-type buried layer as an etching stopper as in Embodiment 1, no parasitic transistor is formed directly below p-type diffused resistor layers.

(8) In case of Embodiment 2, before the step of anisotropic etching, active element portions and a pressure sensor portion can be formed by the standard process of a bipolar IC, and no increase in processing steps is involved. More specifically, the p+-type buried layer 18a as the etching stopper can be formed simultaneously with the p+-type buried layer 18b with forms the part of the isolation region. In addition, the n+-type buried layer 20a for preventing the parasitic transistor can be formed simultaneously with the n+-type buried layers 20b of the active element portions.

What is claimed is:

1. In a method of manufacturing a semiconductor device wherein diffused resistors for a pressure sensor are formed in a front surface of a semiconductor crystal body, a rear surface of which is thereafter etched partly so as to put a part of the body into a membrane portion; a method of manufacturing a semiconductor device having a pressure sensor characterized in that, in advance of the etching step, a buried layer which has an impurity concentration higher than that of the semiconductor body and which has the gradient of the impurity concentration is provided in said semiconductor body, whereupon said body is partly etched from its rear surface while an etching rate is being controlled by the high concentration buried layer.

2. A method of manufacturing a semiconductor device having a pressure sensor as defined in claim 1, wherein said semiconductor crystal body has the (100) plane.

3. A method of manufacturing a semiconductor device having a pressure sensor as defined in claim 2, wherein said etching step is performed by anisotropic etching with an alkali etchant.

4. A method of manufacturing a semiconductor device having a pressure sensor as defined in claim 1, wherein said semiconductor body consists of a p-type silicon substrate on which an n-type silicon layer is epitaxially grown, and said high concentration impurity buried layer is an n+-type buried layer which is formed in a selected part of a front surface of said silicon substrate before the growth of said silicon layer.

5. A method of manufacturing a semiconductor device having a pressure sensor as defined in claim 4, wherein the impurity concentration of said n+-type buried layer has a peak value of at least $10^{19}$ atoms/cm$^3$.

6. A method of manufacturing a semiconductor device having a pressure sensor and at least one active element, comprising the steps of:
(1) preparing a first conductivity type semiconductor substrate which has first and second major surfaces;
(2) introducing a first conductivity type impurity into selected parts of said first major surface, to form first and second buried layers which are isolated from each other;
(3) introducing a second conductivity type impurity into selected parts of said first major surface, to form a third buried layer which overlies said first buried layer and which is broader than said first buried layer and a fourth buried layer which is spaced from said third buried layer;

(4) forming a second conductivity type semiconductor layer on said first major surface by epitaxial growth;

(5) introducing the first conductivity type impurity into the selected part of the front surface of said semiconductor layer, to form an isolation semiconductor region which reaches said second buried layer;

(6) introducing the first conductivity type impurity into selected parts of the major surface of said semiconductor layer which is surrounded with said first semiconductor region and which is located over said first buried layer, to form a plurality of semiconductor resistor layers which are used as said pressure sensor;

(7) introducing the first conductivity type impurity into selected parts of said major surface of said semiconductor layer which is located over said fourth buried layer, to form semiconductor regions which are used as said active element;

(8) forming metal wiring layers which are connected to said semiconductor resistor layers and the active element semiconductor regions; and (9) etching said semiconductor substrate selectively from said second major surface so as to reach said first buried layer, to form a diaphragm.

7. A method of manufacturing a semiconductor device having a pressure sensor and at least one active element, as defined in claim 6, wherein said semiconductor substrate has the (100) plane, and said step (9) is anisotropic etching with an alkali etchant.

8. A method of manufacturing a semiconductor device having a pressure sensor and at least one active element, as defined in claim 6, wherein before said step (9), said first buried layer is formed so as to have a peak value of at least $10^{19}$ atoms/cm$^3$ as its impurity concentration.

9. A method of manufacturing a semiconductor device having a pressure sensor and at least one active element, as defined in claim 7, wherein before said step (9), siad first buried layer is formed so as to have a peak value of at least $10^{19}$ atoms/cm$^3$ as its impurity concentration.

* * * * *